United States Patent
Nogami et al.

(10) Patent No.: US 7,776,710 B2
(45) Date of Patent: Aug. 17, 2010

(54) MANUFACTURING METHOD OF SEMICONDUCTOR WAFER HAVING A TRENCH STRUCTURE AND EPITAXIAL LAYER

(75) Inventors: Syouji Nogami, Tokyo (JP); Yukichi Horioka, Tokyo (JP); Shoichi Yamauchi, Tokyo (JP)

(73) Assignees: Sumco Corporation, Tokyo (JP); Denso Corporation, Aichi (JP)

( * ) Notice: Subject to any disclaimer, the term of this patent is extended or adjusted under 35 U.S.C. 154(b) by 676 days.

(21) Appl. No.: 10/562,235

(22) PCT Filed: Mar. 31, 2005

(86) PCT No.: PCT/JP2005/006268

§ 371 (c)(1),
(2), (4) Date: Oct. 31, 2006

(87) PCT Pub. No.: WO2005/098912

PCT Pub. Date: Oct. 20, 2005

(65) Prior Publication Data

US 2007/0128836 A1 Jun. 7, 2007

(30) Foreign Application Priority Data

Apr. 5, 2004 (JP) .............................. 2004-110634

(51) Int. Cl.
*H01L 21/76* (2006.01)

(52) U.S. Cl. ............................... 438/424; 257/E21.102
(58) Field of Classification Search ................. 438/424; 257/E21.102
See application file for complete search history.

(56) References Cited

U.S. PATENT DOCUMENTS 6,495,294 B1  12/2002  Yamauchi et al.

FOREIGN PATENT DOCUMENTS

| JP | 2001-196573 | 7/2001 |
| JP | 2003-218037 | 7/2003 |

*Primary Examiner*—W. David Coleman
*Assistant Examiner*—Sonya D McCall-Shepard
(74) *Attorney, Agent, or Firm*—Greenblum and Bernstein P.L.C.

(57) ABSTRACT

A resistivity of an epitaxial layer in a trench is changed in a stepwise manner by reducing a quantity of an impurity diffused into the epitaxial layer in the trench from a semiconductor wafer in a stepwise manner, thereby suppressing an influence of auto-doping from the semiconductor wafer.

An epitaxial layer 17 is grown in a trench 16 of a semiconductor wafer 10 having a trench structure by gradually reducing a temperature in a temperature in the range of 400 to 1150° C. by a vapor growth method while supplying a silane gas as a raw material gas, thereby filling the epitaxial layer 17 in the trench 16.

9 Claims, 4 Drawing Sheets

MANUFACTURING METHOD OF SEMICONDUCTOR WAFER HAVING A TRENCH STRUCTURE AND EPITAXIAL LAYER

CROSS-REFERENCE TO RELATED APPLICATIONS

This application claims priority of International Application No. PCT/JP2005/006268, filed Mar. 31, 2005 and Japanese Application No. 2004-110634, filed Apr. 5, 2004, the complete disclosures of which are hereby incorporated by reference.

TECHNICAL FIELD OF THE INVENTION

The present invention relates to a method of manufacturing a semiconductor wafer by forming an epitaxial layer on a surface of a wafer having a trench structure and in a trench by a vapor growth method. Further, the present invention relates to a semiconductor wafer manufactured by this method.

BACKGROUND ART

As a manufacturing method of this type of semiconductor wafer, there has been conventionally disclosed a manufacturing method of a semiconductor substrate (see, e.g., Patent Reference 1) by which an epitaxial film is formed on a semiconductor substrate including the inside of a trench by an epitaxial growth method and etching processing with respect to a part of this epitaxial film and film formation processing of the epitaxial film are repeated more than once to fill the superimposed epitaxial films in the trench.

In a semiconductor substrate manufactured by such a method, since an opening portion in a trench is widened by performing etching processing with respect to a part of an epitaxial film, forming the epitaxial film in this state can prevent the opening portion of the trench from being closed. As a result, it is possible to suppress occurrence of an embedding defect (a cavity) in the trench.

Patent Reference 1: Japanese Unexamined Patent Application Publication No. 2001-196573 (claim 4, Description [0042]-[0048], Description [0049].

DISCLOSURE OF THE INVENTION

Problems to be Solved by the Invention

However, in the manufacturing method of a semiconductor substrate disclosed in the conventional Patent Reference 1, since temperatures when forming respective epitaxial films are the same, when a semiconductor substrate has a low resistance, there is an inconvenience that a resistivity of an epitaxial film in a trench is affected by auto-doping from the semiconductor substrate to the epitaxial film and electrical characteristics of the semiconductor substrate are changed to characteristics different from desired characteristics.

Furthermore, in the manufacturing method of a semiconductor substrate disclosed in the conventional Patent Reference 1, epitaxial growth must be carried out from an initial layer at a low temperature for auto-doping control, and hence there is a problem of a slow growth rate and a bad throughput.

Moreover, in the manufacturing method of a semiconductor substrate disclosed in the conventional Patent Reference 1, since all layers from an initial layer to a last layer have the same growth temperature, when this growth temperature is high, filling a trench becomes harder as trench growth advances and a trench width is narrowed, thus deteriorating trench filling properties.

It is a first object of the present invention to provide a manufacturing method of a semiconductor wafer and a wafer manufactured by this method, by which a resistivity of an epitaxial layer in a trench can be changed in a stepwise manner by reducing a quantity of an impurity diffused in the epitaxial layer in the trench from the semiconductor wafer in a stepwise manner, an influence of auto-doping from the semiconductor wafer can be suppressed, the epitaxial layer can be efficiently grown, and trench filling properties can be improved.

It is a second object of the present invention to provide a manufacturing method of a semiconductor wafer and a wafer manufactured by this method, by which an epitaxial layer can be stably and homogeneously formed in a trench based on a vapor growth method by removing a native oxide film or an organic matter formed on a surface in the trench or on a surface of the epitaxial layer in the trench.

It is a third object of the present invention to provide a manufacturing method of a semiconductor wafer and a wafer manufactured by this method, by which generation of a void which is apt to be formed in the vicinity of a center of a trench can be reduced and a surface of an epitaxial layer formed in the trench can be smoothened.

It is a fourth object of the present invention to provide a manufacturing method of a semiconductor wafer and a wafer manufactured by this method, by which an auto-doping quantity itself from the semiconductor wafer to an epitaxial layer can be reduced by growing the epitaxial layer based on a vapor growth method at a relatively low temperature.

Means for Solving the Problems

As shown in FIGS. 1 and 2, the invention according to claim 1 provides a manufacturing method of a semiconductor wafer, wherein an epitaxial layer 17 is grown in a trench 16 of a semiconductor wafer 10 having a trench structure by gradually reducing a temperature in a temperature range of 400 to 1150° C. by a vapor growth method or by gradually reducing a temperature and then lowering the temperature at a predetermined rate while supplying a silane gas as a raw material gas, thereby filling the trench 16 with the epitaxial layer 17.

In this manufacturing method of a semiconductor wafer according to claim 1, since a temperature when forming the epitaxial layer 17 in the trench 16 by the vapor growth method is gradually reduced or gradually reduced and then lowered at the predetermined speed, a quantity of an impurity diffused in the epitaxial layer 17 from the semiconductor wafer 10 is decreased in a stepwise manner.

As shown in FIGS. 1 and 2, the invention according to claim 2 is the invention defined in claim 1 and further includes: a step of forming a first layer 11 on an inner surface of the trench 16 of the semiconductor wafer 10 at a first temperature in the range of 900 to 1150° C. by a vapor growth method; a step of forming a second layer 12 on a surface of the first layer 11 in the trench 16 at a second temperature in the range of 850 to 1100° C. lower than the first temperature by the vapor growth method; a step of forming a third layer 13 on a surface of the second layer 12 in the trench 16 at a third temperature in the range of 800 to 1050° C. lower than the second temperature by the vapor growth method, thereby filling the trench 16 with the epitaxial layer 17 consisting of the first layer 11, the second layer 12 and the third layer 13.

In the manufacturing method of a semiconductor wafer according to claim 2, since the first layer 11 is formed on the inner surface of the trench 16 at the first temperature by the vapor growth method and then the second layer 12 is formed on the surface of the first layer 11 in the trench 16 at the second temperature lower than the first temperature by the vapor growth method, a diffusion quantity of an impurity from the semiconductor wafer 10 to the first layer 11 and a diffusion quantity of an impurity from the first layer 11 to the second layer 12 when forming the second layer 12 become smaller than those when forming the first layer 11. Additionally, since the second layer 12 is formed on the surface of the first layer 11 in the trench 16 at the second temperature by the vapor growth method and then the third layer 13 is formed on the surface of the second layer 12 in the trench 16 at the third temperature lower than the second temperature by the vapor growth method, a diffusion quantity of an impurity from the semiconductor wafer 10 to the first layer 11, a diffusion quantity of an impurity from the first layer 11 to the second layer 12 and a diffusion quantity of an impurity from the second layer 12 to the third layer 13 when forming the third layer 13 become smaller than those when forming the second layer 12.

As shown in FIG. 1, the invention according to claim 8 is the invention defined in one of claims 2 to 7 and is further characterized in that, when the semiconductor wafer 10 is left in the air for eight hours or more in a state where the trench 16 has been formed in the semiconductor wafer 10 or in a state where the first layer 11, the second layer 12 or the third layer 13 has been formed on the inner surface of the trench 16, the inner surface of the trench 16 is cleansed by using a mixture of an alkaline water solution and hydrogen peroxide water at an etching rate of 0.1 to 1 nm/min and then the semiconductor wafer 10 is dipped in fluorinated acid for 0.1 to 60 minutes and cleansed.

In the manufacturing method of a semiconductor wafer according to claim 8, although the inner surface of the trench 16 or the surface of the first layer 11, the surface of the second layer 12 or the surface of the third layer 13 in the trench 16 is covered with a native oxide film or an organic matter when the semiconductor wafer is left in the air for eight hours or more, the native oxide film or the organic matter is removed, and hence the respective layers 11 to 13 of the epitaxial layer 17 can be stably and homogeneously formed by the vapor growth method.

As shown in FIG. 1, the invention according to claim 9 is the invention defined in claim 8 and is further characterized in that the semiconductor wafer 10 is dipped in an acidic or alkaline etchant for 0.1 to 10 minutes having an etching rate of 0.1 to 1 μm/min to increase a width of the trench 16 before forming the third layer 13 or a fourth layer which is used to completely fill the inside of the trench 16 of the semiconductor wafer 10.

In the manufacturing method of a semiconductor wafer according to claim 9, since the third layer 13 or the fourth layer used to completely fill the inside of the trench 16 rapidly grows in the trench 16 having the increased width, the epitaxial layer 17 can be filled in the trench 16 without forming a void in the vicinity of the center of the trench 16.

The invention according to claim 10 is the invention defined in claim 1 and is further characterized in that a preferable temperature at which the epitaxial layer is grown by the vapor growth method falls within a range of 650 to 950° C.

In the manufacturing method of a semiconductor wafer according to claim 10, since a temperature at which the epitaxial layer is grown by the vapor growth method is low, a quantity of auto-doping from the semiconductor wafer to the epitaxial layer is reduced, i.e., an impurity contained in the semiconductor wafer is hard to be diffused into the epitaxial layer.

The invention according to claim 11 is the invention defined in claim 1 and is further characterized in that a preferable temperature at which the epitaxial layer is grown by the vapor growth method falls within a range of 400° C. to 650° C.

In the manufacturing method of a semiconductor wafer according to claim 11, since a temperature at which the epitaxial layer is grown by the vapor growth method is low, a quantity of auto-doping from the semiconductor wafer to the epitaxial layer is further reduced, i.e., an impurity contained in the semiconductor wafer is further hard to be diffused into the epitaxial layer.

As shown in FIG. 1, the invention according to claim 12 is the semiconductor wafer 10 manufacturing by the method defined in one of claims 1 to 11.

The semiconductor wafer 10 according to claim 12 does not have a void generated in the vicinity of the center of the trench 16 and has desired electrical characteristics.

EFFECTS OF THE INVENTION

As described above, according to the present invention, the epitaxial layer is grown so that the epitaxial layer is filled in the trench by gradually reducing a temperature in a temperature range of 400 to 1150° C. based on the vapor growth method or by gradually reducing a temperature and then lowering the temperature at a predetermined speed while supplying a silane gas as a raw material gas into the trench of the semiconductor wafer having the trench structure, and hence a quantity of an impurity diffused into the epitaxial layer from the semiconductor wafer is reduced in a stepwise manner. As a result, a resistivity of the epitaxial layer in the trench can be changed in a stepwise manner, and an influence of auto-doping from the semiconductor wafer can be suppressed, thereby obtaining desired electrical characteristics.

Further, since an initial growth temperature can be increased in the present invention as compared with a conventional semiconductor substrate manufacturing method by which epitaxial growth is carried out from an initial layer at a low temperature for auto-doping and in which a growth rate is slow and a throughput is bad, epitaxial growth can be efficiently performed. Furthermore, since all layers from the initial layer to the last layer have the same growth temperature, as compared with the conventional semiconductor substrate manufacturing method in which trench filling properties are deteriorated when a growth temperature is high, low-temperature conditions under which the trench can be readily filled can be realized as epitaxial growth advances and a trench width is narrowed in the present invention, thereby improving the trench filling properties.

Moreover, when the first layer is formed on the trench inner surface of the semiconductor wafer at the first temperature by the vapor growth method, the second layer is formed on the first layer surface in the trench at the second temperature lower than the first temperature by the vapor growth method, the third layer is formed on the second layer surface in the trench at the third temperature lower than the second temperature by the vapor growth method and the trench is filled with the epitaxial layer consisting of the first layer, the second layer and the third layer, a diffusion quantity of an impurity contained in the semiconductor wafer into the epitaxial layer is reduced in a stepwise manner from the first layer toward the third layer through the second layer, and hence an influence of auto-doping from the semiconductor wafer to the epitaxial layer can be suppressed, thus obtaining desired electrical characteristics. The present invention is particularly effective when the epitaxial layer is grown in the trench based on the vapor growth method by using the semiconductor wafer which aboundingly contains an impurity and has a low resistivity.

When the semiconductor wafer is left in the air for eight hours or more in a state where the trench has been formed in the semiconductor wafer or in a state where the first layer, the second layer or the third layer has been formed on the trench inner surface, cleansing the trench inner surface by using a mixture of an alkaline wafer solution and hydrogen peroxide solution at an etching rate of 0.1 to 1 nm/min and then cleansing the same by using fluorinated acid can remove a native oxide film or an organic matter covering the trench inner surface, thereby stably and homogeneously forming each layer in the epitaxial layer by the vapor growth method.

Further, when the semiconductor wafer is dipped in an acidic or alkaline etchant for 0.1 to 10 minutes having an etching rate of 0.1 to 1 μm/min to increase a width of the trench before forming the third layer or the fourth layer required to completely fill the inside of the trench of the semiconductor wafer, the third layer or the fourth layer required to completely fill the inside of the trench rapidly grows in the trench having the increased width. As a result, the epitaxial layer can be filled in the trench without forming a void in the vicinity of the center of the trench.

Furthermore, when a temperature at which the epitaxial layer is grown by the vapor growth method falls within a range of 650° C. to 950° C. or 400° C. to 650° C., since the temperature at which the epitaxial layer is grown by the vapor growth method is low, a quantity of auto-doping from the semiconductor wafer to the epitaxial layer is reduced. As a result, desired electrical characteristics of the semiconductor wafer can be obtained.

Moreover, the semiconductor wafer manufactured by the above-described method does not have a void generated in the vicinity of the center of the trench, and has desired electrical characteristics.

Figure 1:
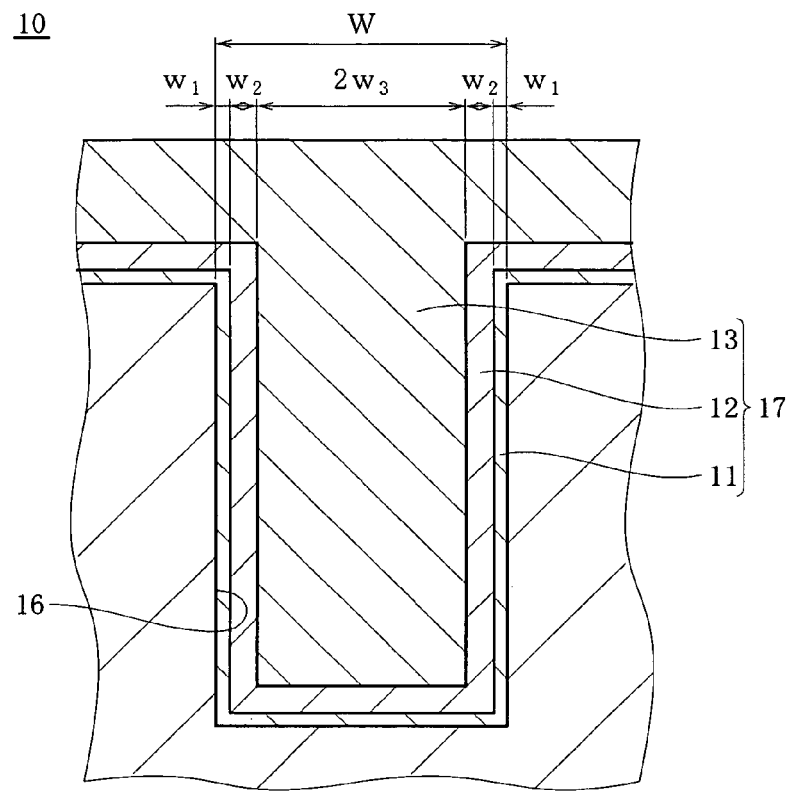
FIG. 1 is a cross-sectional view of a primary part showing the inside of a trench of a semiconductor wafer according to a first embodiment of the present invention.

REFERENCE NUMERALS 10, 20, 30, 40 silicon wafer
11, 21, 31, 41 first layer
12, 22, 32, 42 second layer
13, 23, 33, 43 third layer
24, 44 fourth layer
16, 26, 36, 46 trench
17, 27, 37, 47 epitaxial layer

BEST MODE FOR CARRYING OUT THE INVENTION

The best mode for carrying out the present invention will now be described hereinafter with reference to the accompanying drawings.

First Embodiment

Figure 2:
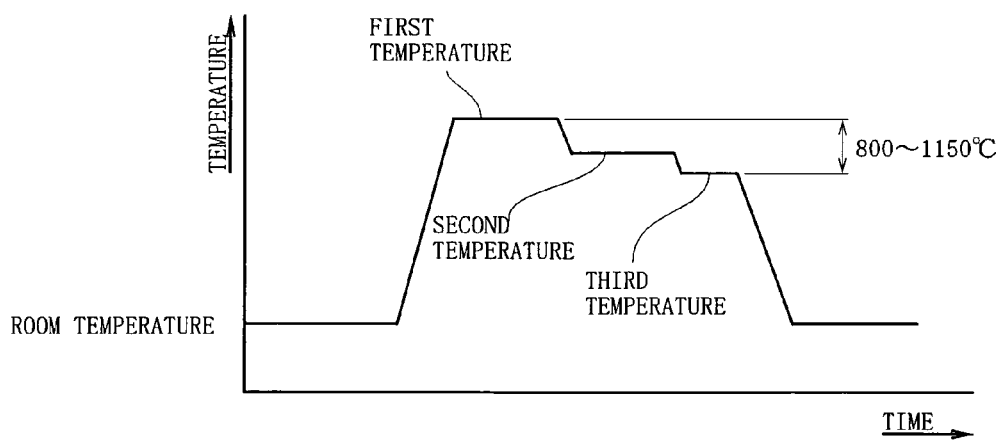
FIG. 2 is a view showing temperature conditions under which the semiconductor wafer is manufactured.

As shown in FIGS. 1 and 2, after a trench 16 is formed on a surface of a silicon wafer 10 by a photo-etching method, an epitaxial layer 17 is grown on the surface of this wafer 10 and in the trench 16 by gradually reducing a temperature in a temperature range of 400 to 1150° C. based on a vapor growth method while supplying a silane gas as a raw material gas. As a result, the surface of the wafer 10 is covered with the epitaxial layer 17, and the epitaxial layer 17 is filled in the trench 16. Here, the entire temperature range when growing the epitaxial layer 17 by the vapor growth method is restricted to the range of 400 to 1150° C. because there is a problem such as polycrystallization or an increase in defects when the temperature is less than 400° C. and there is another problem, i.e., deterioration in a profile due to auto-doping when the temperature exceeds 1150° C. Specifically, the wafer 10 is first put into a reactor, and a first layer 11 is formed on the surface of the wafer 10 and an inner surface of the trench 16 at a first temperature in the range of 900 to 1150° C., preferably, 950 to 1100° C. by the vapor growth method. Here, the first temperature is restricted to the range of 900 to 1150° C. because there is a problem such as polycrystallization or an increase in defects when the temperature is less than 900° C. and there is another problem, i.e., deterioration in a profile due to auto-doping when the temperature exceeds 1150° C.

As the vapor growth method, there is a chemical vapor deposition method (a CVD method), a physical vapor deposition method (a PVD method) or the like, but it is preferable to grow the epitaxial layer 17 by the CVD method in view of its crystallinity, mass productivity, simplicity of an apparatus, easiness of formation of various device structures and others. Additionally, a monosilane gas ($SiH_4$), a disilane gas ($Si_2H_6$), a trichlorosilane gas ($SiHCl_3$), a dichlorosilane gas ($SiH_2Cl_2$), a monochlorosilane gas ($SiH_3Cl$) or a silicon tetrachloride gas ($SiCl_4$) as the silane gas is introduced together with a hydrogen gas ($H_2$) into the reactor when growing the epitaxial layer 17 by the CVD method in such a manner that a pressure in the reactor becomes $1.3 \times 10^{-5}$ to $1.0 \times 10^{-1}$ MPa. As a result, the raw material gas is thermally decomposed or reduced, and silicon is separated out on the surface of the wafer 10 and the inner surface of the trench 16, thereby forming the epitaxial layer 17.

Further, assuming that a width of the trench 16 is W, a thickness $w_1$ of the first layer 11 is set in a range of (W/20)

$\leq w_1 \leq (W/10)$, preferably, $(W/15) \leq w_1 \leq (W/12)$. Here, the thickness $w_1$ of the first layer 11 is restricted to the range of $(W/20) \leq w_1 \leq (W/10)$ because there is a problem, i.e., an increase in defects due to wafer surface properties when the thickness is less than W/20 and there is another problem, i.e., occurrence of deterioration in a profile due to auto-doping when the thickness exceeds W/10. It is to be noted that the thickness of the first layer 11 is determined based on a temperature and a pressure in the reactor, a flow quantity of the raw material gas introduced into the reactor, a reaction time with the raw material gas of the wafer 10 and others.

Then, growth of the first layer 11 is stopped, and a second layer 12 is formed on a surface of the first layer 11 on the wafer 10 and the surface of the first layer 11 in the trench 16 by the vapor growth method in a state where a temperature in the reactor has been reduced to a second temperature in the range of 850 to 1100° C., preferably, 900 to 1050° C. lower than the first temperature. It is preferable to form the second layer 12 by the same method as that of the first layer 11. Here, the second temperature is restricted to the range of 850 to 1100° C. because there is a problem such as polycrystallization or an increase in defects when the temperature is less than 850° C. and there is another problem, i.e., occurrence of deterioration in a profile due to auto-doping when the temperature exceeds 1100° C. Furthermore, a thickness $w_2$ of the second layer 12 is set to $(W/10) \leq w_2 \leq (W/5)$, preferably, $(W/8) \leq w_2 \leq (W/6)$. Here, the thickness $w_2$ of the second layer 12 is restricted to the range of $(W/10) \leq w_2 \leq (W/5)$ because there is a problem, i.e., an increase in defects when the thickness is less than W/10 and there is another problem, i.e., occurrence of deterioration in a profile due to auto-doping when the thickness exceeds W/5.

Furthermore, growth of the second layer 12 is stopped, and a third layer 13 is formed on a surface of the second layer 12 on the wafer 10 and the surface of the second layer 12 in the trench 16 by the vapor growth method in a state where the temperature in the reactor has been reduced to a third temperature in the range of 800 to 1050° C., preferably, 850 to 1000° C. lower than the second temperature so that the epitaxial layer 17 consisting of the first layer 11, the second layer 12 and the third layer 13 is filled in the trench 16. It is preferable to form the third layer 13 by the same method as those of the first layer 11 and the second layer 12. Here, the third temperature is restricted to the range of 800 to 1050° C. because there is a problem such as polycrystallization or an increase in defects when the temperature is less than 800° C. and there is another problem, i.e., deterioration in a profile due to auto-doping when the temperature exceeds 1050° C. Assuming that a thickness of the third layer 13 is $w_3$, $2w_3 = W - 2(w_1 + w_2)$ is achieved.

It is to be noted that the semiconductor wafer is dipped in an acidic or alkaline etchant having an etching rate of 0.1 to 1 μm/min, preferably, 0.2 to 0.5 μm/min for 0.1 to 10 minutes, preferably, 5 to 8 minutes to increase a width of the trench 16 after forming the second layer 12 on the surface of the wafer 10 and in the trench 16 and before forming the third layer 13. As a result, since the third layer 13 required to completely fill the inside of the trench 16 rapidly grows in the trench 16 having the increased width, the epitaxial layer 17 can be filled in the trench 16 without forming a void in the vicinity of a center of the trench 16. Here, the etching rate is restricted to the range of 0.1 to 1 μm/min because there is a problem of an increase in an etching processing time when the etching rate is less than 0.1 μm/min and there is another problem of making it difficult to control in wet etching when the etching rate exceeds 1 μm/min. Furthermore, the dipping time in the acidic or alkaline etchant is restricted to the range of 0.1 to 10 minutes because there is a problem that the trench is not sufficiently opened when the dipping time is less than 0.1 minute and there is another problem that a trench shape collapses when the dipping time exceeds 10 minutes.

Moreover, when the semiconductor wafer 10 is left in the air for eight hours or more after forming the trench 16 in the wafer 10 and before forming the first layer 11, or after forming the first layer 11 and before forming the second layer 12, or after forming the second layer 12 and before forming the third layer 13, the inner surface of the trench 16 is cleansed by using a mixture of an alkaline water solution and hydrogen peroxide solution at an etching rate of 0.1 to 1 nm/min, preferably, 0.3 to 0.8 nm/min and then the semiconductor wafer is dipped in fluorinated acid for 0.1 to 60 minutes, preferably, 2 to 4 minutes and cleansed. This dipping time in the fluorinated acid is restricted to the range of 0.1 to 60 minutes because the surface of the wafer 10 or the inner surface of the trench 16 is covered with a native oxide film or an organic matter, and the first to third layers 11 to 13 of the epitaxial layer 17 is stably and homogeneously formed by removing the native oxide film or the organic matter. Here, the etching rate is restricted to the range of 0.1 to 1 nm/min because there is a problem of an increase in an etching processing time when the etching rate is less than 0.1 nm/min and there is another problem such as occurrence of particles or a roughened surface when the etching rate exceeds 1 nm/min.

In the thus manufactured silicon wafer 10, since the first layer 11 is formed on the surface of the wafer 10 and the inner surface of the trench 16 at the first temperature by the vapor growth method and then the second layer 12 is formed on the surface of the first layer 11 on the wafer 10 and the surface of the first layer 11 in the trench 16 at the second temperature lower than the first temperature by the vapor growth method, a diffusion quantity of an impurity from the wafer 10 to the first layer 11 and a diffusion quantity of an impurity from the first layer 11 to the second layer 12 when forming the second layer 12 are smaller than those when forming the first layer 11. Additionally, since the second layer 12 is formed on the surface of the first layer 11 on the wafer 10 and the surface of the first layer 11 in the trench 16 at the second temperature by the vapor growth method and then the third layer 13 is formed on the surface of the second layer 12 on the wafer 10 and the surface of the second layer 12 in the trench 16 at the third temperature lower than the second temperature by the vapor growth method, a diffusion quantity of an impurity from the wafer 10 to the first layer 11, a diffusion quantity of an impurity from the first layer 11 to the second layer 12 and a diffusion quantity of an impurity from the second layer 12 to the third layer 13 when forming the third layer 13 are smaller than those when forming the second layer 12. As a result, since a diffusion quantity of an impurity contained in the wafer 10 into the epitaxial layer 17 is reduced in a stepwise manner from the first layer 11 toward the third layer 13 through the second layer 12, an influence of auto-doping from the wafer 10 to the epitaxial layer 17 can be suppressed, thereby obtaining desired electrical characteristics. The present invention is particularly effective when growing the epitaxial layer 17 on the surface of the wafer 10 and in the trench 16 based on the vapor grow method using the wafer 10 having a low resistivity in which a large quantity of an impurity such as boron is doped.

Second Embodiment

Figure 3:
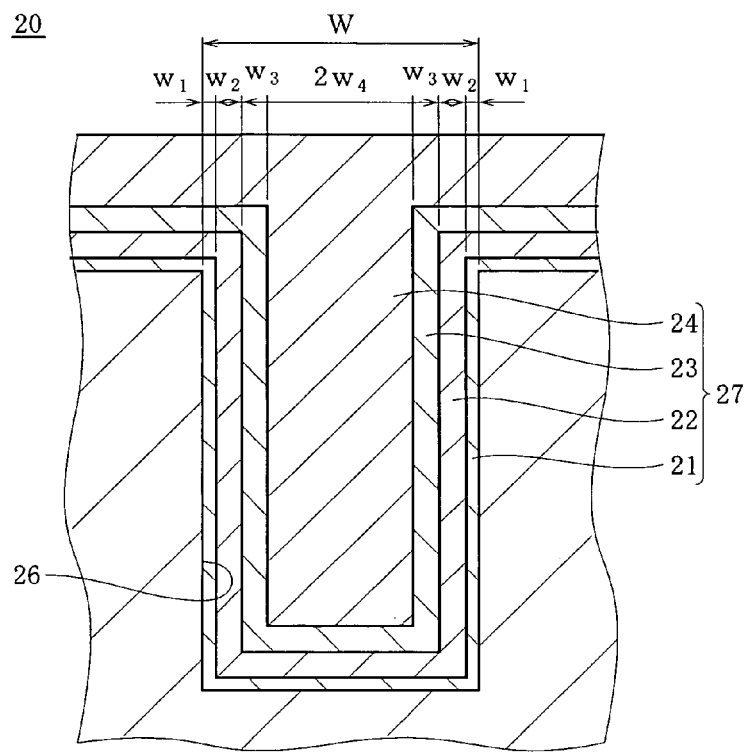
FIG. 3 is a cross-sectional view of a primary part showing the inside of a trench of a semiconductor wafer according to a second embodiment of the present invention.
Figure 4:
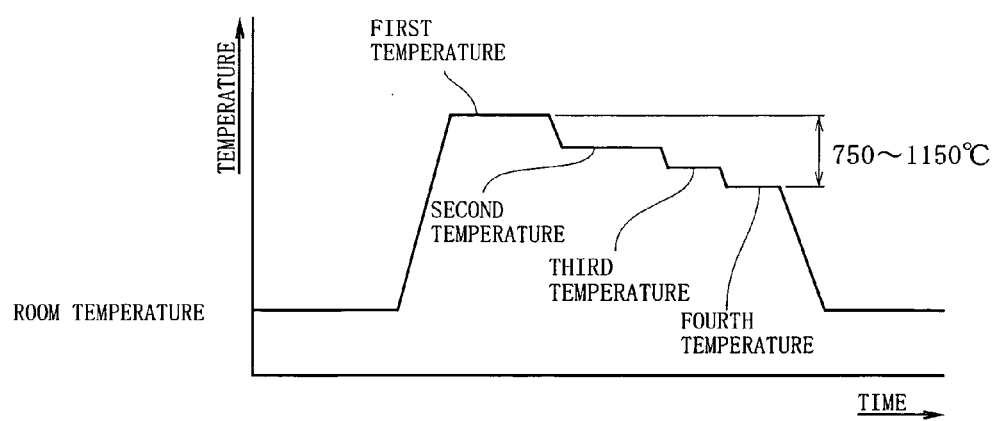
FIG. 4 is a view showing temperature conditions under which the semiconductor wafer is manufactured.

FIGS. 3 and 4 show a second embodiment according to the present invention.

In this embodiment, first to fourth layers 21 to 24 are formed on a surface of a silicon wafer 20 and an inner surface of a trench 26 by a vapor growth method while supplying a silane gas as a raw material gas. The first to third layers 21 to 23 are formed like the first to third layers in the first embodiment. Specifically, the wafer 20 is first put into a reactor, and the first layer 21 is formed on the surface of the wafer 20 and the inner surface of the trench 26 at a first temperature in the range of 900 to 1150° C., preferably, 950 to 1100° C. by the vapor growth method. Assuming that a width of the trench 26 is W, a thickness $w_1$ of this first layer 21 is set in a range of $(W/20) \leqq w_1 \leqq (W/10)$, preferably, $(W/15) \leqq w_1 \leqq (W/12)$. Then, growth of the first layer 21 is stopped, and the second layer 22 is formed on a surface of the first layer 21 on the wafer 20 and the surface of the first layer 21 in the trench 26 by the vapor growth method in a state where a temperature in the reactor has been reduced to a second temperature in the range of 850 to 1100° C., preferably, 900 to 1050° C. lower than the first temperature. A thickness $w_2$ of this second layer 22 is set to $(W/10) \leqq w_2 \leqq (W/5)$, preferably, $(W/8) \leqq w_2 \leqq (W/6)$.

Subsequently, growth of the second layer 22 is stopped, and the third layer 23 is formed on a surface of the second layer 22 on the wafer 20 and the surface of the second layer 22 in the trench 26 by the vapor growth method in a state where the temperature in the reactor has been reduced to a third temperature falling with a range of 800 to 1050° C., preferably, 850 to 1000° C. lower than the second temperature. A thickness $w_3$ of this third layer 23 is set to $(W/10) \leqq w_3 \leqq (W/5)$, preferably, $(W/8) \leqq w_3 \leqq (W/6)$. Here, the thickness $w_3$ of the third layer 23 is restricted to the range of $(W/10) \leqq w_3 \leqq (W/5)$ because there is a problem of an increase in defects when the thickness is less than W/10 and there is another problem of occurrence of deterioration in a profile due to auto-doping when the thickness is not smaller than W/5. Further, growth of the third layer 23 is stopped, and the fourth layer 24 is formed on a surface of the third layer 23 on the wafer 20 and the surface of the third layer 23 in the trench 26 by the vapor growth method in a state where the temperature in the reactor has been reduced to a fourth temperature in the range of 750 to 1000° C., preferably, 800 to 950° C. lower than the third temperature, thereby filling an epitaxial layer 27 consisting of the first layer 21, the second layer 22, the third layer and the fourth layer 24 in the trench 26. It is preferable to form the fourth layer 24 by the same method as those of the first to third layers 21 to 23. Here, the fourth temperature is restricted to the range of 750 to 1000° C. because there is a problem of polycrystallization or an increase in defects when the temperature is less than 750° C. and there is another problem of auto-doping when the temperature exceeds 1000° C. Assuming that a thickness of the fourth layer 24 is $w_4$, $2w_4 = W - 2(w_1 + w_2 + w_3)$ is achieved. Any other structure is the same as that in the first embodiment.

It is to be noted that the silicon wafer is dipped in an acidic or alkaline etchant having an etching rate of 0.1 to 1 μm/min, preferably, 0.2 to 0.5 μm/min for 0.1 to 10 minutes, preferably, 5 to 8 minutes to increase a width of the trench 26 after forming the third layer 23 on the surface of the wafer 20 and in the trench 26 and before forming the fourth layer 24. As a result, the fourth layer 24 required to completely fill the trench 26 rapidly grows in the trench 26 having the increased width, and hence the epitaxial layer 27 can be filled in the trench 26 without forming a void in the vicinity of a center of the trench 26.

Furthermore, when the silicon wafer is left in the air for eight hours or more after forming the trench 26 in the wafer 20 and before forming the first layer 21, or after forming the first layer 21 and before forming the second layer 22, or after forming the second layer 22 and before forming the third layer 23, or after forming the third layer 23 and before forming the fourth layer 24, the inner surface of the trench 26 is cleansed by using a mixture of an alkaline water solution and hydrogen peroxide solution at an etching rate of 0.1 to 1 nm/min, preferably, 0.5 to 0.8 nm/min, and then it is cleansed by using fluorinated acid. This is performed since the surface of wafer 20 or the inner surface of the trench 26 is covered with a native oxide film or an organic matter due to the left state, and the first to fourth layers 21 to 24 of the epitaxial layer 27 are stably and homogeneously formed by removing the native oxide film or the organic matter.

In the thus manufactured silicon wafer 20, since the second layer 22 is formed on the surface of the first layer 21 on the wafer 20 and the surface of the first layer 21 in the trench 26 at the second temperature lower than the first temperature by the vapor growth method after forming the first layer 21 on the surface of the wafer 20 and the inner surface of the trench 26 at the first temperature by the vapor growth method, a diffusion quantity of an impurity from the wafer 20 to the first layer 21 and a diffusion quantity of an impurity from the first layer 21 to the second layer 22 when forming the second layer 22 are smaller than those when forming the first layer 21. Furthermore, since the third layer 23 is formed on the surface of the second layer 22 on the wafer 20 and the surface of the second layer 22 in the trench 26 at the third temperature lower than the second temperature by the vapor growth method after forming the second layer 22 on the surface of the first layer 21 on the wafer 20 and the surface of the first layer 21 in the trench at the second temperature by the vapor growth method, a diffusion quantity of an impurity from the wafer 20 to the first layer 21, a diffusion quantity of an impurity from the first layer 21 to the second layer 22 and a diffusion quantity of an impurity from the second layer 22 to the third layer 23 when forming the third layer 23 are smaller than those when forming the second layer 22. Moreover, since the fourth layer 24 is formed on the surface of the third layer 23 on the wafer 20 and the surface of the third layer 23 in the trench 26 at the fourth temperature lower than the fourth temperature by the vapor growth method after forming the third layer 23 on the surface of the second layer 22 on the wafer and the surface of the second layer 22 in the trench 26 at the third temperature by the vapor growth method, a diffusion quantity of an impurity from the wafer 20 to the first layer 21, a diffusion quantity of an impurity from the first layer 21 to the second layer 22, a diffusion quantity of an impurity from the second layer 22 to the third layer 23 and a diffusion quantity of an impurity from the third layer 23 to the fourth layer 24 when forming the fourth layer 24 are smaller than those when forming the third layer 23. As a result, since the diffusion quantity of an impurity contained in the wafer 20 to the epitaxial layer 27 is reduced in a stepwise manner from the first layer 21 toward the fourth layer 24 through the second layer 22 and the third layer 23, an influence of auto-doping from the wafer 20 to the epitaxial layer 27 can be further suppressed as compared with the first embodiment, thereby obtaining desired electrical characteristics. The present invention is particularly effective when growing the epitaxial layer 27 on the surface of the wafer 20 and in the trench 26 based on the vapor growth method using the wafer 20 having a low resistivity in which a large quantity of an impurity such as boron is doped.

Third Embodiment

Figure 5:
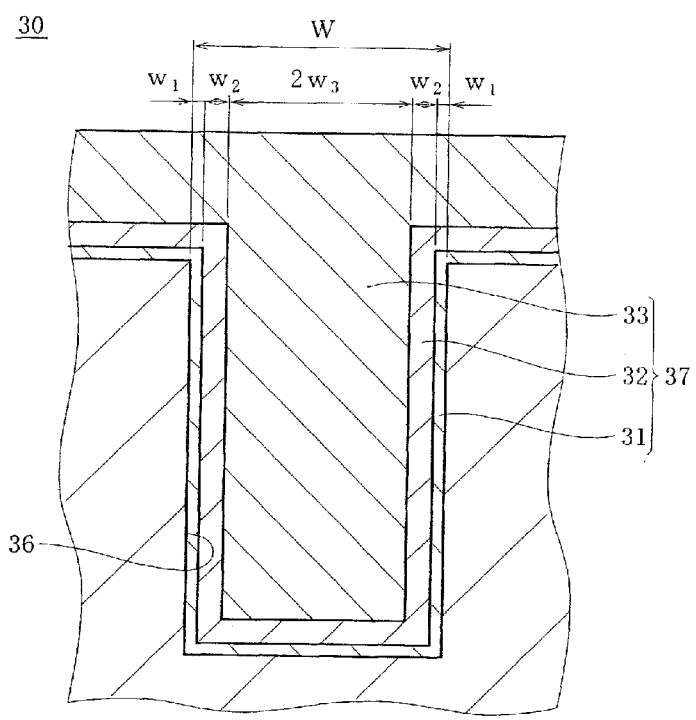
FIG. 5 is a cross-sectional view of a primary part showing the inside of a trench of a semiconductor wafer according to a third embodiment of the present invention.
Figure 6:
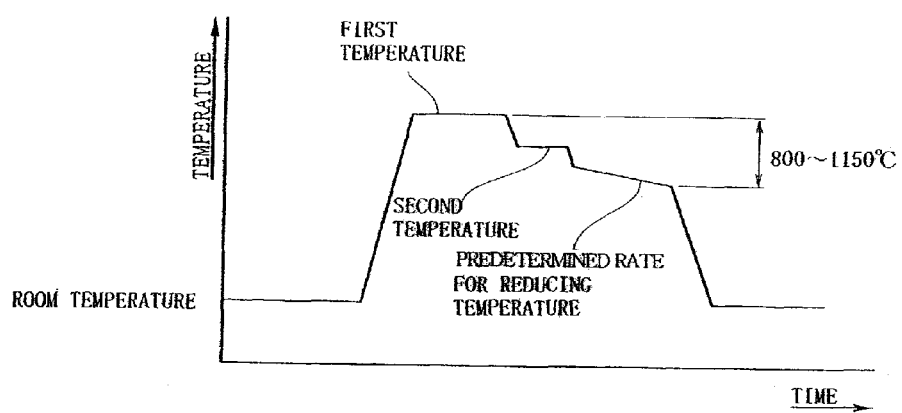
FIG. 6 is a view showing temperature conditions under which the semiconductor wafer is manufactured.

FIGS. 5 and 6 show a third embodiment according to the present invention.

In this embodiment, first to third layers 31 to 33 are formed on a surface of a silicon wafer 30 and an inner surface of a trench 36 by a vapor growth method while supplying a silane gas as a raw material gas. The first and the second layers 31 and 32 are formed like the first and second layers in the first embodiment. Specifically, the wafer 30 is first put into a reactor, and the first layer 31 is formed on the surface of the wafer 30 and the inner surface of the trench 36 at a first temperature in the range of 900 to 1150° C., preferably, 950 to 1100° C. by a vapor growth method. Assuming that a width of the trench 36 is W, a thickness $w_1$ of this first layer 31 is set to a range of $(W/20) \leq w_1 \leq (W/10)$, preferably, $(W/15) \leq w_1 \leq (W/12)$. Then, growth of the first layer 31 is stopped, and the second layer 32 is formed on a surface of the first layer 31 on the wafer 30 and the surface of the first layer 31 in the trench 36 in a state where a temperature in the reactor has been reduced to a second temperature in the range of 850 to 1100° C., preferably, 900 to 1050° C. lower than the first temperature. A thickness $w_2$ of this second layer 32 is set to $(W/10) \leq w_2 \leq (W/5)$, preferably, $(W/8) \leq w_2 \leq (W/6)$.

Moreover, growth of the second layer 32 is stopped, and the third layer 33 is formed on a surface of the second layer 32 on the wafer 30 and the surface of the second layer 32 in the trench 36 by the vapor growth method while reducing the temperature to reach 800° C. from the second temperature at a speed of 1 to 100° C./min, preferably, 6 to 10° C./min, thereby filling an epitaxial layer 37 consisting of the first layer 31, the second layer 32 and the third layer 33 in the trench 36. Here, the rate for reducing temperature when forming the third layer 33 is restricted to the range of 1 to 100° C./min because there is a problem of an increase in a growth time when the rate for reducing temperature is less than 1° C./min and there is another problem of occurrence of a defect when the rate for reducing temperature exceeds 100° C. Additionally, the minimum temperature when forming the third layer 33 is restricted to 800° C. because the epitaxial layer 37 does not grow on the surface of the wafer 30 and the inner surface of the trench 36 when the minimum temperature is less than 800° C. Assuming that a thickness of the third layer 33 is $w_3$, $2w_3 = W - 2(w_1 + w_2)$ is achieved. Any other structure is the same as that in the first embodiment.

In the thus manufactured silicon wafer 30, the third layer 33 has characteristics of profile uniformity superior to those of the third layer in the first embodiment. Any other operation is substantially the same as the operation in the first embodiment, thereby eliminating the tautological explanation.

Fourth Embodiment

Figure 7:
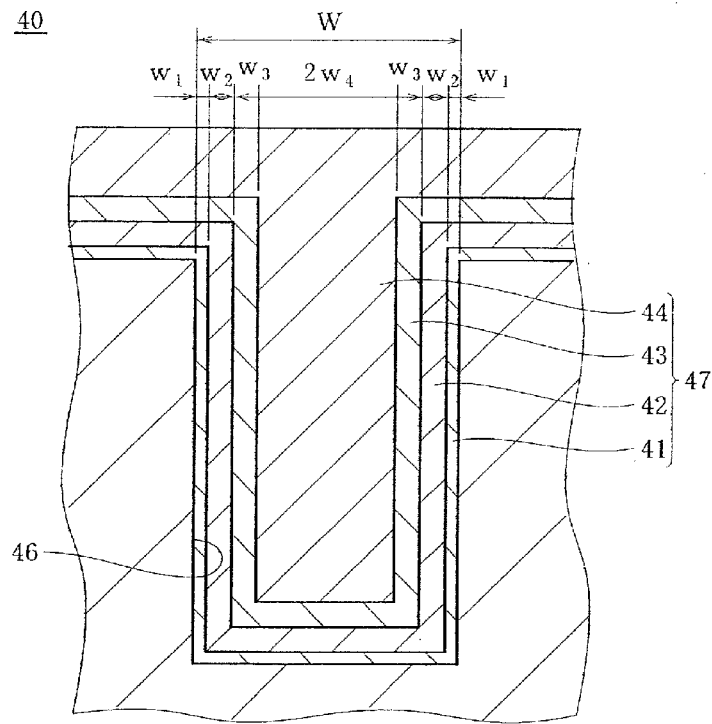
FIG. 7 is a cross-sectional view of a primary part showing the inside of a trench of a semiconductor wafer according to a fourth embodiment of the present invention.
Figure 8:
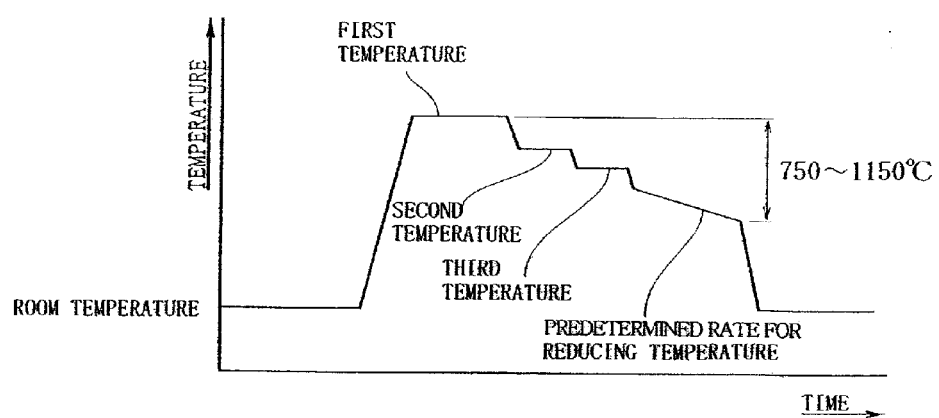
FIG. 8 is a view showing temperature conditions under which the semiconductor wafer is manufactured.

FIGS. 7 and 8 show a fourth embodiment according to the present invention.

In this embodiment, first to fourth layers 41 to 44 are formed on a surface of a silicon wafer 40 and an inner surface of a trench 46 by a vapor growth method while supplying a silane gas as a raw material gas. The first to third layers 41 to 43 are formed like the first to third layers in the second embodiment. Specifically, the wafer 40 is first put into a reactor, and the first layer 41 is formed on the surface of the wafer 40 and the inner surface of the trench 46 at a first temperature in the range of 900 to 1150° C., preferably, 950 to 1100° C. by the vapor growth method. Assuming that a width of the trench is W, a thickness $w_1$ of this first layer 41 is set to a range of $(W/20) \leq w_1 \leq (W/10)$, preferably, $(W/15) \leq w_1 \leq (W/12)$. Then, growth of the first layer 41 is stopped, and the second layer 42 is formed on a surface of the first layer 41 on the wafer 40 and the surface of the first layer 41 in the trench 46 in a state where a temperature in the reactor has been reduced to a second temperature in the range of 850 to 1050° C., preferably, 900 to 1000° C. lower than the first temperature. A thickness $w_2$ of this second layer 42 is set to $(W/10) \leq w_2 \leq (W/5)$, preferably, $(W/8) \leq w_2 \leq (W/6)$.

Then, growth of the second layer 42 is stopped, and the third layer 43 is foamed on a surface of the second layer 42 on the wafer 40 and the surface of the second layer 42 in the trench 46 by the vapor growth method in a state where the temperature in the reactor has been reduced to a third temperature in the range of 800 to 1000° C., preferably, 850 to 950° C. lower than the second temperature. A thickness $w_3$ of this third layer 43 is set to $(W/10) \leq w_3 \leq (W/5)$, preferably, $(W/8) \leq w_3 \leq (W/6)$. Moreover, growth of the third layer 43 is stopped, and the fourth layer 44 is formed on a surface of the third layer 43 on the wafer 40 and the surface of the third layer 43 in the trench 46 by the vapor growth method while reducing the temperature to reach 750° C. from the third temperature at a speed of 1 to 100° C./min, preferably, 6 to 10° C./min, thereby filling an epitaxial layer 47 consisting of the first layer 41, the second layer 42, the third layer 43 and the fourth layer 44 in the trench 46. Here, the rate for reducing temperature when forming the fourth layer 44 is restricted to the range of 1 to 100° C./min because there is a problem of an increase in a growth time when the speed for reducing temperature is less than 1° C./min and there is another problem of an increase in defects when the speed for reducing temperature exceeds 100° C. Additionally, the minimum temperature when forming the fourth layer 44 is restricted to 750° C. because the epitaxial layer 47 does not grow on the surface of the wafer 40 and the inner surface of the trench 46 when the minimum temperature is less than 750° C. Assuming that a thickness of the fourth layer 44 is $w_4$, $2w_3 = W - 2(w_1 + w_2 + w_3)$ is achieved. Any other structure is the same as that in the second embodiment.

In the thus manufactured silicon wafer 40, the fourth layer 44 has characteristics of a dopant profile superior to those of the fourth layer in the third embodiment. Any other operation is substantially the same as the operation in the second embodiment, thereby eliminating the tautological explanation.

It is to be noted that the entire temperature range when allowing the epitaxial layer to grow in the trench of the semiconductor wafer by the vapor growth method is 750 to 1150° C. in the first to fourth embodiments, but this range may be 650 to 950° C. Specifically, when forming the epitaxial layer consisting of the first layer, the second layer and the third layer, the first temperature is set to 850 to 950° C., the second temperature is set to 750 to 850° C. lower than the first temperature, and the third temperature is set to 650 to 750° C. lower than the second temperature. Further, when forming the epitaxial layer consisting of the first layer, the second layer, the third layer and the fourth layer, the first temperature is set to 850 to 950° C., the second temperature is set to 800 to 900° C. lower than the first temperature, the third temperature is set to 750 to 850° C. lower than the second temperature, and the fourth temperature is set to 650 to 800° C. lower than the third temperature. In such cases, since the temperature at which the epitaxial layer is grown by the vapor growth method is low, a quantity of auto-doping from the semiconductor wafer to the epitaxial layer is reduced, thereby obtaining excellent electrical characteristics.

Further, although the entire temperature range when allowing the epitaxial layer to grow in the trench of the semiconductor wafer by the vapor growth method is 750 to 1150° C. in the first to fourth embodiments, this temperature range may be 400 to 650° C. Specifically, when forming the epitaxial layer consisting of the first layer, the second layer and the third layer, the first temperature is set to 500 to 650° C., the second temperature is set to 450 to 600° C. lower than the first temperature, and the third temperature is set to 400 to 550° C. lower than the second temperature. Furthermore, when forming the epitaxial layer consisting of the first layer, the second layer, the third layer and the fourth layer, the first temperature is set to 550 to 650° C., the second temperature is set to 500 to 600° C. lower than the first temperature, the third temperature is set to 450 to 550° C. lower than the second temperature, and the fourth temperature is set to 400 to 500° C. lower than the third temperature. In such cases, since the temperature at which the epitaxial layer is grown by the vapor growth method is further low, a quantity of auto-doping from the semiconductor wafer to the epitaxial layer is further reduced, thereby obtaining more excellent electrical characteristics.

Furthermore, although the silicon wafer has been exemplified as the semiconductor wafer in the first to fourth embodiments, it may be a GaAs wafer, an InP wafer, a ZnS wafer or a ZnSe wafer.

Moreover, although the epitaxial layer consisting of the three layers is formed in the trench in the first and third embodiments and the epitaxial layer consisting of the four layers is formed in the trench in the second and fourth embodiments, an epitaxial layer consisting of two layers or five or more layers may be formed in the trench.

INDUSTRIAL APPLICABILITY

The present invention can be applied to obtain desired electrical characteristics of a semiconductor wafer by changing a resistivity of an epitaxial layer in a trench in a stepwise manner and suppressing an influence of auto-doping with respect to the semiconductor wafer. In particular, the present invention is effective when growing an epitaxial layer on a surface of a semiconductor wafer and in a trench based on a vapor growth method using the semiconductor wafer having a low resistivity in which a large quantity of an impurity such as boron is doped.

The invention claimed is:

1. A manufacturing method of a semiconductor wafer, wherein an epitaxial layer is grown in a trench of a semiconductor wafer having a trench structure by gradually reducing a temperature in a temperature range of 400 to 1150° C. and then lowering the temperature at a rate of 1 to 100° C./min based on a vapor growth method while supplying a silane gas as a raw material gas, thereby filling the epitaxial layer in the trench.

2. The manufacturing method of a semiconductor wafer according to claim 1, comprising:
   a step of forming a first layer on an inner surface of the trench of the semiconductor wafer at a first temperature in the range of 900 to 1150° C. by the vapor growth method;
   a step of forming a second layer on a surface of the first layer in the trench at a second temperature in the range of 850 to 1100° C. lower than the first temperature by the vapor growth method; and
   a step for forming a third layer on a surface of the second layer in the trench by the vapor growth method while reducing a temperature from the second temperature at a rate of 1 to 100° C./min so that the epitaxial layer consisting of the first layer, the second layer and the third layer is filled in the trench.

3. The manufacturing method of a semiconductor wafer according to claim 1, comprising:
   a step of forming a first layer on an inner surface of the trench of the semiconductor wafer at a first temperature in the range of 900 to 1150° C. by the vapor growth method;
   a step of forming a second layer on a surface of the first layer in the trench at a second temperature in the range of 850 to 1100° C. lower than the first temperature by the vapor growth method;
   a step of forming a third layer on a surface of the second layer in the trench at a third temperature in the range of 800 to 1050° C. by the vapor growth method; and
   a step of forming a fourth layer on a surface of the third layer in the trench by the vapor growth method while reducing a temperature from the third temperature at a rate of 1 to 100° C./min so that the epitaxial layer consisting of the first layer, the second layer, the third layer and the fourth layer is filled in the trench.

4. The manufacturing method of a semiconductor wafer according to claim 1, wherein a temperature at which the epitaxial layer is grown by the vapor growth method falls within a range of 650 to 950° C.

5. The manufacturing method of a semiconductor wafer according to claim 1, wherein a temperature at which the epitaxial layer is grown by the vapor growth method falls within a range of 400° C. to 650° C.

6. The manufacturing method of a semiconductor wafer according to claim 2, wherein, when the semiconductor wafer is left in the air for eight hours or more in a state where the trench has been formed in the semiconductor wafer or in a state where the first layer, the second layer or the third layer has, been formed on the inner surface of the trench, the semiconductor wafer is dipped in a mixture, of an alkaline water solution and hydrogen peroxide solution having an etching rate of 0.1 to 1 nm/min for 1 to 10 minutes and cleansed, and then the semiconductor wafer is dipped in fluorinated acid for 0.1 to 60 minutes and cleansed.

7. The manufacturing method of a semiconductor wafer according to claim 2, wherein a thickness $w_1$ of the first layer is $(W/20) \leq w_1 \leq (W/10)$, a thickness $w_2$ of the second layer is $(W/10) \leq w_2 \leq (W/5)$, and the remainder is the third layer, where W is a width of the trench.

8. The manufacturing method of a semiconductor wafer according to claim 3, wherein a thickness $w_1$ of the first layer is $(W/20) \leq w_1 \leq (W/10)$, a thickness $w_2$ of the second layer is $(W/10) \leq w_2 \leq (W/5)$, a thickness $w_3$ of the third layer is $(W/10) \leq w_3 \leq (W/5)$, and the remainder is the fourth layer, where W is a width of the trench.

9. The manufacturing method of a semiconductor wafer according to claim 6, wherein the semiconductor wafer is dipped in an acidic or alkaline etchant having an etching rate of 0.1 to 1 μm/min for 0.1 to 10 minutes to increase a width of the trench before forming the third layer or the fourth layer required to completely fill the inside of the trench of the semiconductor wafer.

* * * * *